(12) United States Patent
Yang et al.

(10) Patent No.: US 12,354,873 B2
(45) Date of Patent: Jul. 8, 2025

(54) SYSTEM AND METHOD FOR MULTIPLE STEP DIRECTIONAL PATTERNING

(71) Applicant: Taiwan Semiconductor Manufacturing Co., Ltd., Hsinchu (TW)

(72) Inventors: Chih-Kai Yang, Hsinchu (TW); Yu-Tien Shen, Hsinchu (TW); Hsiang-Ming Chang, Hsinchu (TW); Chun-Yen Chang, Hsinchu (TW); Ya-Hui Chang, Hsinchu (TW); Wei-Ting Chien, Hsinchu (TW); Chia-Cheng Chen, Hsinchu (TW); Liang-Yin Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 229 days.

(21) Appl. No.: 17/353,400

(22) Filed: Jun. 21, 2021

(65) Prior Publication Data

US 2022/0102139 A1   Mar. 31, 2022

Related U.S. Application Data

(60) Provisional application No. 63/085,543, filed on Sep. 30, 2020.

(51) Int. Cl.
*H01L 21/027* (2006.01)
*G03F 7/00* (2006.01)
*H01L 21/311* (2006.01)
*H01L 21/3115* (2006.01)
*H01L 21/768* (2006.01)

(52) U.S. Cl.
CPC ...... *H01L 21/0273* (2013.01); *G03F 7/70058* (2013.01); *H01L 21/31144* (2013.01); *H01L 21/31155* (2013.01); *H01L 21/76877* (2013.01)

(58) Field of Classification Search
CPC ............ H01L 21/0273; H01L 21/31144; H01L 21/31155
See application file for complete search history.

(56) References Cited

U.S. PATENT DOCUMENTS

| | | | |
|---|---|---|---|
| 8,133,804 B1 * | 3/2012 | Godet | H01J 37/3056 438/528 |
| 8,529,728 B2 * | 9/2013 | Charatan | G03F 7/40 156/345.24 |
| 9,905,754 B1 | 2/2018 | Yoon et al. | |
| 10,310,379 B2 * | 6/2019 | Ma | H01L 21/266 |
| 2002/0160619 A1 * | 10/2002 | Yamada | H01L 21/0273 438/723 |

(Continued)

FOREIGN PATENT DOCUMENTS

| | | |
|---|---|---|
| CN | 103155090 A | 6/2013 |
| CN | 103620730 A | 3/2014 |

(Continued)

*Primary Examiner* — Bac H Au
(74) *Attorney, Agent, or Firm* — Seed IP Law Group

(57) ABSTRACT

A semiconductor process system includes an ion source configured to bombard with a photoresist structure on a wafer. The semiconductor process system reduces a width of the photoresist structure by bombarding the photoresist structure with ions in multiple distinct ion bombardment steps having different characteristics.

20 Claims, 12 Drawing Sheets

(56) References Cited

U.S. PATENT DOCUMENTS

| | | | |
|---|---|---|---|
| 2009/0124069 A1 | 5/2009 | Clark, Jr. et al. | |
| 2009/0314965 A1* | 12/2009 | Wu | H01L 21/0273 430/5 |
| 2013/0062309 A1* | 3/2013 | Godet | H01L 21/0273 216/41 |
| 2014/0272728 A1* | 9/2014 | Sinclair | G03F 7/40 430/327 |
| 2016/0064239 A1* | 3/2016 | Shih | H01L 21/0273 438/694 |
| 2017/0178911 A1* | 6/2017 | Ma | H01L 21/76816 |
| 2017/0338103 A1* | 11/2017 | Shih | H01L 21/0273 |
| 2018/0204719 A1 | 7/2018 | Ma et al. | |
| 2019/0348279 A1 | 11/2019 | Zhang et al. | |
| 2021/0389679 A1* | 12/2021 | Huang | H01L 21/26586 |

FOREIGN PATENT DOCUMENTS

| | | |
|---|---|---|
| CN | 107230727 A | 10/2017 |
| KR | 20090044838 A | 5/2009 |
| KR | 20130138786 A | 12/2013 |
| KR | 20180082851 A | 7/2018 |
| KR | 20190063430 A | 6/2019 |
| KR | 20200036772 A | 4/2020 |
| TW | 201517162 A | 5/2015 |
| TW | 201628045 A | 8/2016 |
| WO | 9621235 A1 | 7/1996 |

\* cited by examiner

SYSTEM AND METHOD FOR MULTIPLE STEP DIRECTIONAL PATTERNING

BACKGROUND

Technical Field

The present disclosure relates to the field of semiconductor processing. The present disclosure relates more particularly to patterning features on semiconductor wafers.

Description of the Related Art

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. Many etching processes involve depositing a layer of photoresist and patterning the photoresist by exposing the photoresist to ultraviolet light through a photolithography mask. The mask includes the pattern to be formed in the photoresist. However, as the size of desired features decreases, it can be difficult to pattern the photoresist in the desired manner.

BRIEF DESCRIPTION OF THE SEVERAL VIEWS OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
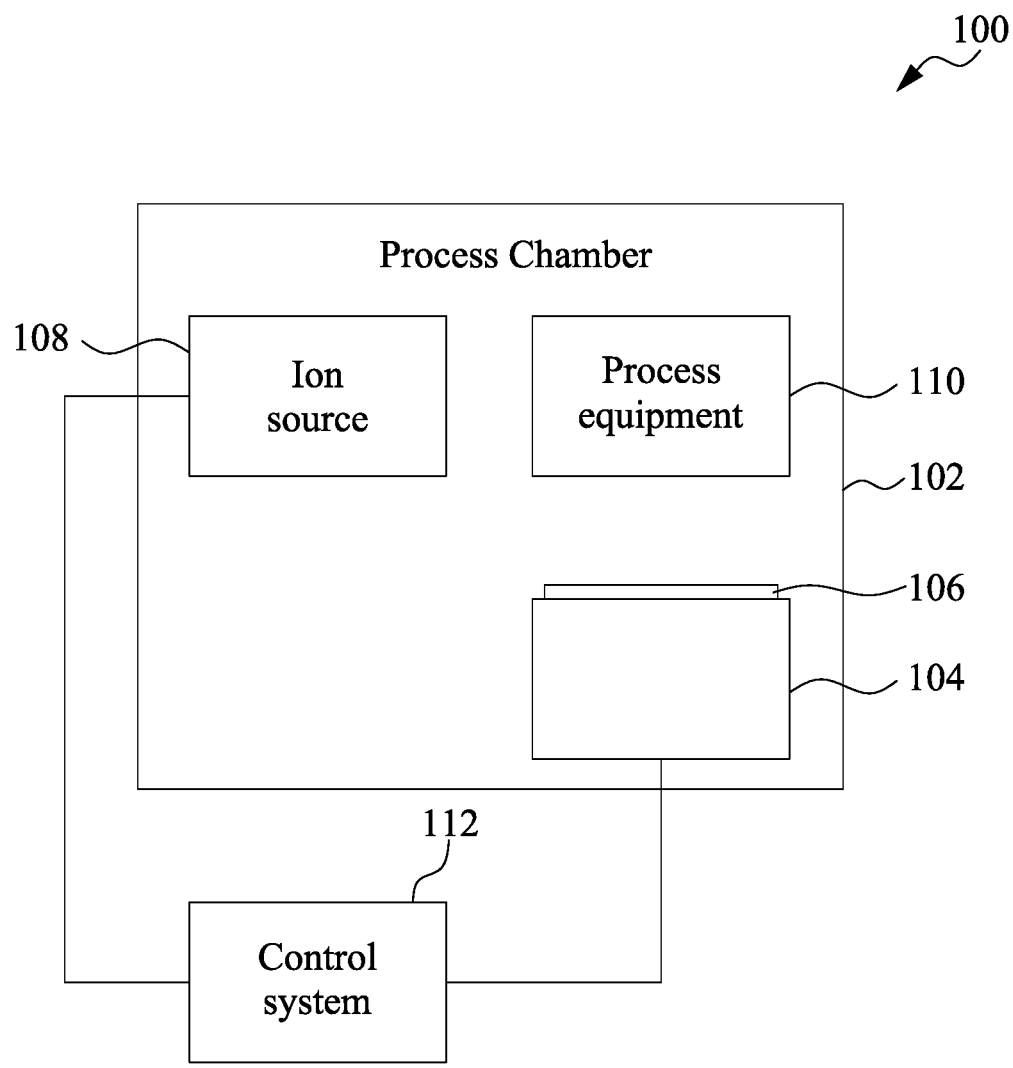
FIG. 1 is an illustration of a semiconductor process system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure decrease the size of photoresist structures after initial patterning of the photoresist. Photoresist is initially deposited on a wafer and patterned by exposure to light through a mask. This initial patterning process forms trenches or apertures in the photoresist. The remaining photoresist separates the trenches or apertures. After initial patterning, the lateral dimensions of the remaining photoresist structures may be greater than desired. Embodiments of the present disclosure reduce the lateral dimensions of the remaining photoresist by removing a portion of the remaining photoresist with multiple steps of directional ion bombardment. The multiple steps of directional ion bombardment reduce the lateral dimensions of remaining photoresist structures and correspondingly increase the width of trenches or apertures. This is highly beneficial because structures can be formed closer together.

FIG. 1 is a simplified illustration of a semiconductor process system 100, according to one embodiment. The semiconductor process system includes a process chamber 102. A wafer support 104 is positioned in the process chamber 102. The wafer support 104 supports a wafer 106 in the process chamber 102. An ion source 108 is positioned in the process chamber 102. As will be set forth in greater detail below, the components of the semiconductor process system 100 cooperate to pattern photoresist on the wafer 106 via multiple steps of ion bombardment.

FIG. 1 illustrates a single process chamber 102. However, as will be set forth in more detail below, it is possible that some of the processes described below may be performed in different process chambers.

The semiconductor process system 100 includes semiconductor process equipment 110. The semiconductor process equipment 110 assists in performing semiconductor processes. The semiconductor process equipment 110 can include equipment that assists in photolithography processes. For example, the semiconductor process equipment 110 can include equipment for depositing a layer of photoresist on the wafer 106. The semiconductor process equipment 110 can include equipment for performing an initial patterning of the photoresist. Accordingly, the semiconductor process equipment 110 can include photolithography masks, ultraviolet light generation equipment, and associated optical equipment for directing ultraviolet light onto the photoresist layer.

The process equipment can include equipment for performing thin-film deposition processes, etching processes, ion implantation processes, annealing processes, photolithography processes, and other types of processes. Some of the semiconductor process equipment 110 may be positioned partially within the process chamber 102 and partially external to the process chamber 102. Some of the semiconductor process equipment 110 may be positioned entirely external to the process chamber 102.

The semiconductor process equipment 110 can include equipment for managing fluid flow within the process chamber 102. The process equipment can include components for introducing gasses or fluids into the process chamber 102, for removing gasses or fluids from the process chamber, and for monitoring and controlling the flow, presence, or composition of gasses within the process chamber 102. The semiconductor process equipment 110 can include equipment for retaining a selected pressure within the interior of the process chamber 102.

The semiconductor process equipment 110 can include electrical components for generating electric fields, voltages, magnetic fields, electrical signals, or other types of electrical effects. Accordingly, the semiconductor process equipment 110 can include electrodes, wires, radiofrequency power sources, transmitters, receivers, or other types of electrical equipment that may be utilized in semiconductor processes.

The semiconductor process equipment 110 is utilized to deposit a layer of photoresist on the wafer 106. After the layer of photoresist has been deposited on the wafer 106, the semiconductor process equipment 110 performs an initial patterning of the photoresist. The initial patterning forms trenches or apertures in the photoresist in accordance with the pattern of a photolithography mask. In particular, the photoresist is exposed to light via the mask, thereby changing the structure of the photoresist that is exposed to light. The portion of the photoresist that is not exposed to light due to the presence of the mask does not undergo structural change. The initial patterning process includes removing either the portion of the photoresist that was changed by exposure to the light, or the portion of the photoresist that was not changed by exposure to light, depending on the type of photoresist and photolithography process utilized. The removal of the photoresist after exposure results in the initial pattern of trenches and apertures in the photoresist.

Due to limitations of photolithography processes, it is possible that the remaining photoresist structures that define the trenches and apertures have one or more lateral dimensions that are wider than desired. As used herein, lateral dimensions correspond to X and Y dimensions that are mutually orthogonal to each other and to the Z dimension that corresponds to the vertical thickness of the photoresist. Accordingly, the lateral width of some of the remaining photoresist structures may be larger than desired due to limitations of photolithography processes.

The system 100 utilizes the ion source 108 to reduce a lateral width of remaining portions of the photoresist after initial patterning. The ion source 108 outputs an ion beam including toward the wafer 106 at a selected angle relative to vertical. The ions bombard or impact the photoresist. The impact of the ions on the remaining photoresist structures removes a portion of the remaining photoresist structures. This reduces the lateral width of the remaining photoresist structures. This reduction in lateral photoresist dimensions by directional ion bombardment may be termed a directional push.

The ion source 108 bombards the photoresist structures with ions in multiple steps. In a first ion bombardment step, the ions travel with an angle relative to vertical, have an energy, and a dose level. In a second subsequent ion bombardment step, one or more aspects of the ion beam is changed from the first ion bombardment step. Accordingly, in the second ion bombardment step, one or more of the angle of travel, the energy, or the dose level of the ion beam is changed from the first ion bombardment step. The two ion bombardment steps with different characteristics result in a more effective reduction in width of the remaining photoresist features than if only a single ion bombardment step is performed or if the second ion bombardment step was identical to the first ion bombardment step.

In one embodiment, in the first ion bombardment step the ions are output toward the wafer 106 with a first angle relative to vertical. In the second subsequent ion bombardment step, the ions are output toward the wafer 106 with a second angle different than the first angle. This combination of different ion bombardment angles reduces the effects of shadowing and results in effective removal of photoresist. Shadowing can reduce the effectiveness of the ion bombardment processes. Further details regarding shadowing are set forth in relation to FIGS. 2A-2L.

In one embodiment, in the first ion bombardment step the ions are output toward the wafer 106 with a first energy. In the second subsequent ion bombardment step, the ions are output toward the wafer 106 with a second energy different than the first energy. This combination of different ion bombardment energies reduces hardening and results in effective photoresist removal. The energy of an ion corresponds to its kinetic energy. For two ions of the same mass, the ion with more energy will have a higher velocity than the ion with less energy.

In one embodiment, in the first ion bombardment step a first dose of ions are output from the ion source 108 to the wafer 106. In the second subsequent ion bombardment step, a second dose of ions different than the first dose are output from the ion source 108 to the wafer 106 . . . . As used herein, a dose corresponds to the number of ions that bombard the wafer 106 in a given ion bombardment step. A higher ion bombardment dose corresponds to a greater number of ions bombarding the wafer 106. If the number of ions per second is constant for two ion bombardment steps, then a higher dose can correspond to bombarding the wafer 106 for a longer period of time.

In practice, the two ion bombardment steps will be performed for each side of a photoresist structure. If a photoresist structure is considered as a vertical wall having two vertical sides and a top surface, then in one embodiment the two ion bombardment steps will be performed first on one vertical side and then on the other vertical side. Accordingly, after the two ion bombardment steps have been performed on the first vertical side, then the two ion bombardment steps will be performed on the second vertical side. To accomplish this, the wafer 106 is rotated 180° in the X-Y plane after the first two ion bombardment steps. The second two ion bombardment steps are then performed after the rotation.

In one embodiment, the first ion bombardment step is first performed on a first vertical side of a photoresist structure. The wafer is then rotated 180° in the X-Y plane and the first ion bombardment step is then performed on the second vertical side of the photoresist structure. The second ion bombardment step is then performed on the second vertical side of the photoresist structure. The wafer is then rotated 180° in the X-Y plane and the second ion bombardment step is performed on the first vertical side of the photoresist structure.

The system 100 includes a control system 112. The control system 112 is coupled to the ion source 108. The control system 112 sends commands to the ion source 108 to control the parameters of ion bombardment. Accordingly, the control system 112 can control the ion source 108 to output ions with a selected angle, a selected energy, and a selected dose. The control system 112 controls the ion source 108 to change one or more of these parameters from the first ion bombardment step to the second ion bombardment step.

The control system 112 may also be coupled to the process equipment 110. The control system 112 can control the function of the process equipment 110. The control system 112 may also be coupled to the support 104. The control system 112 may control rotation of the support 104. In particular, after the first and second ion bombardment step have been performed on a first side of a photoresist feature, the control system 112 can cause the support 104 to rotate the wafer 106 180°. The control system 112 can then cause the ion source 108 to perform the first and second ion bombardment steps on the second side of the photoresist feature. Alternatively, the system 100 can include a robot arm or other mechanisms for rotating the wafer 106 between sets of ion bombardment steps. The control system 112 can control the robot arm or other mechanisms.

Figure 2A:
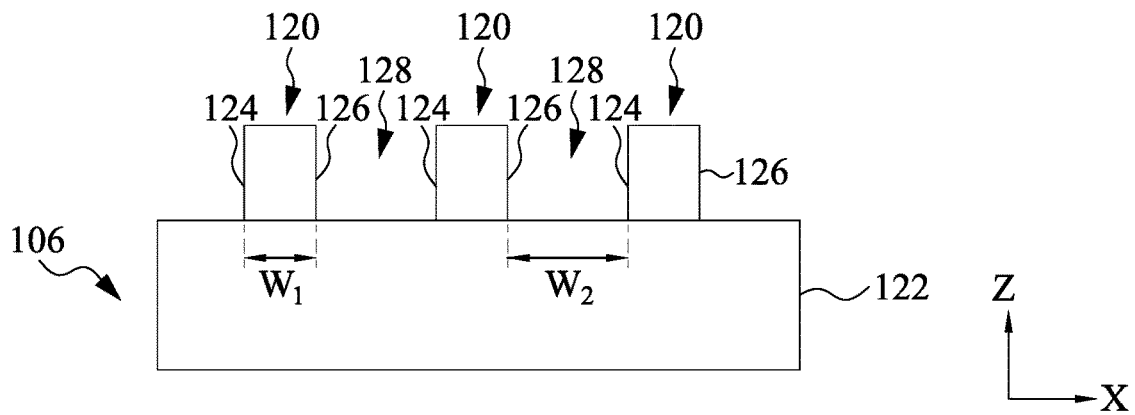
FIGS. 2A-2J are cross-sectional views of a wafer, according to one embodiment.

FIG. 2A is a cross-sectional view of a wafer 106 at an intermediate stage of processing, according to one embodiment. The wafer includes a substrate 122 and photoresist structures 120 on the substrate 122. The substrate 122 can include a dielectric layer, a conductive layer, a semiconductor layer, or other type of material. In one example, the substrate 122 is an interlevel dielectric layer such as silicon oxide, silicon nitride, or other suitable dielectric materials.

The photoresist structures 120 are remnants of a photoresist layer that has been patterned with an initial patterning process. The initial patterning process can include standard photolithography patterning such as exposure to ultraviolet light to a mask, and removal of exposed or unexposed photoresist.

The photoresist structures 120 each include a first side 124, a second side 126, and a top surface. The photoresist structures can be considered photoresist walls. The photoresist structures each have a width W1. The initial patterning process defines trenches 128 between adjacent photoresist structures 120. The trenches 128 each have a width W2 between adjacent photoresist structures. FIG. 2A illustrates that the X dimension is the lateral dimension between adjacent photoresist structures 120. FIG. 2A illustrates that the Z dimension is the vertical dimension. The top views of FIGS. 2K and 2L illustrates that the Y dimension is the lateral dimension perpendicular to the X dimension and the Z dimension. In the view of FIG. 2A, the Y dimension corresponds to the dimension into and out of the sheet.

In some cases, it is desirable to decrease the width W1 of the photoresist structures 120. This can correspond to widening the trenches 128. As described previously, standard photolithography processes may not be able to produce photoresist structures 120 with lateral dimensions as small as desired.

One solution to reduce the width of the photoresist structures 120 is to bombard them with ions. In order to reduce the lateral dimension, the walls 124 and 126 can be bombarded with the ions. In order to bombard the walls 124 and 126 with ions, the ions will travel at an angle relative to vertical. However, bombarding the sidewalls 124 and 126 at an angle presents some difficulties. If the angle is too great relative to vertical, then the ions will be blocked from hitting the lower parts of the side wall 124 or 126 of the photoresist structure 120 by an adjacent photoresist structure 120. Thus, material will only be removed from an upper portion of the wall 124 or 126. This issue is known as shadowing. If the ion bombardment angle is reduced such that ions can impact the entire wall 124 or 126, less photoresist material is removed because fewer ions per surface area impact the wall. Furthermore, ion beams can produce a hardening effect on the sides 124 and 126 of the photoresist structures 120. The hardening of the photoresist results in less material being removed.

Embodiments of the present disclosure overcome or reduce the effects of hardening or shadowing by performing ion bombardment on each side 124 and 126 in two separate ion bombardment steps. One or more characteristics of the ion bombardment is changed between the first step and the second step. Some of the characteristics that can be changed include bombardment angle, ion energy, and dose level.

FIGS. 2B-2H illustrate a change in bombardment angle between the first bombardment step and the second bombardment step. However, as will be set forth in more detail below, other characteristics aside from or in addition to bombardment angle can be changed between the first bombardment step and the second bombardment step.

Figure 2B:
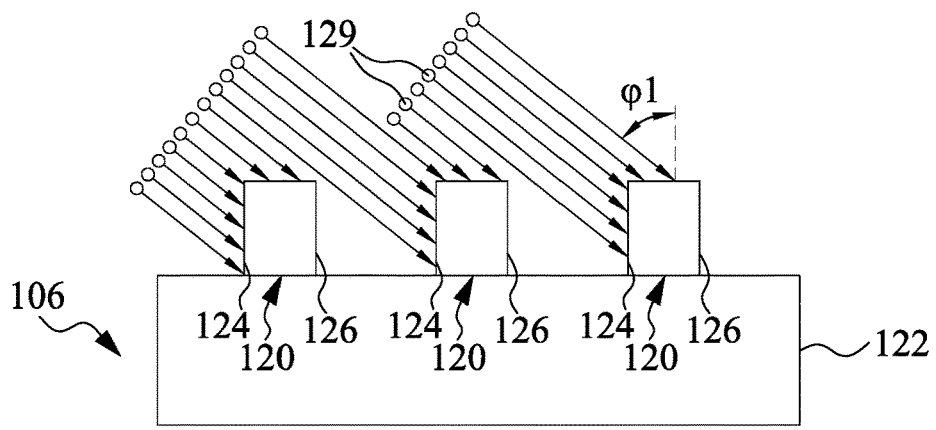

FIG. 2B illustrates a first ion bombardment step of the first sides 124 of the photoresist structures 120. This can also be considered bombardment of the first sides of the trenches 128. Ions 129 are emitted from the ion source 108 (see FIG. 1). The ions 129 travel at an angle $\theta_1$ with respect to vertical. As can be seen in FIG. 2B, the ions 129 impact the upper portions of the sides 124 but do not impact the lower portions of the sides 124. This is because of the shadowing effect described previously. In particular, the ions 129 that would impact the lower portions of the sides 124 are blocked from doing so by the adjacent photoresist structure 120. The larger the angle $\theta_1$ is relative to vertical, the smaller will be the portions of the sides 124 that are impacted by ions 129. Nevertheless, it is beneficial to perform a first ion bombardment step at the first angle $\theta_1$ to bombard upper portions of the sides 124. In one embodiment, the ions 129 are argon ions. However, the ions 129 can be other types of ions without departing from the scope of the present closure.

In one embodiment, the first angle $\theta_1$ is between 55° and 65° relative to vertical. If the angle $\theta_1$ is above this range, then an insufficient upper portion of the walls 124 may be impacted by ions 129 for the first bombardment step. If the angle $\theta_1$ is lower than this range, then an insufficient number of ions per unit area may impact the walls 124 for the first ion bombardment step. In one example, the angle $\theta_1$ is 60°. Other angles for 01 can be utilized without departing from the scope of the present disclosure.

Figure 2C:
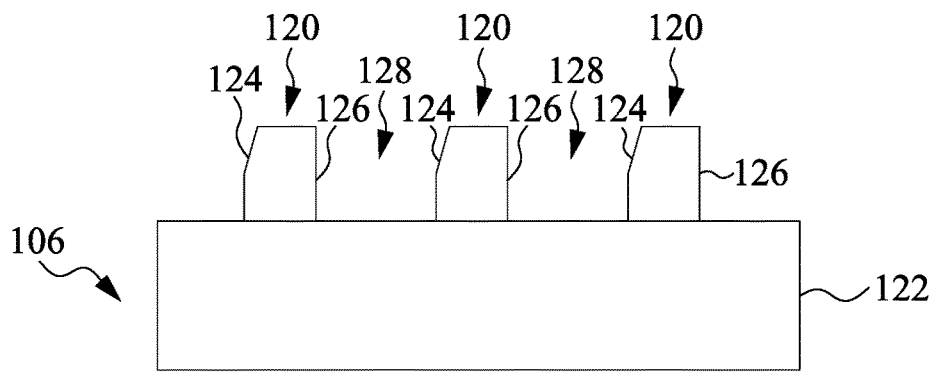

FIG. 2C illustrates the wafer 106 after the first ion bombardment step of the sides 124 of the photoresist structures 120. As can be seen, photoresist material has been removed from the upper portions of the sides 124 of the photoresist structures 120. No material has been removed from the lower portions of the sides 124 of the photoresist structures 120.

Figure 2D:
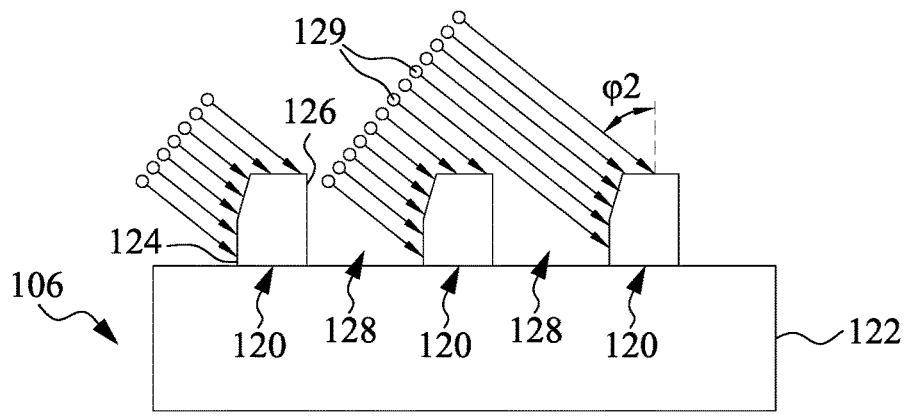

FIG. 2D illustrates a second ion bombardment step of the first sides 124 of the photoresist structures 120, or of the first sides of the trenches 128. The ion source 108 outputs the ions 129 at a second angle $\theta_2$ relative to vertical. The angle $\theta_2$ is different than the first angle $\theta_1$. The angle $\theta_2$ is smaller than the angle $\theta_1$ relative to vertical. The angle $\theta_2$ is selected so that ions 129 impact the entirety of the sides 124 of the photoresist structures 120. In the second ion bombardment step there is no shadowing effect.

In one embodiment, the second angle $\theta_2$ is between 40° and 50° relative to vertical. If the angle $\theta_2$ is above this range, then shadowing may occur and the photoresist material will not be removed from the lower portions of the sides 124. If the angle $\theta_2$ is lower than this range, then an insufficient number of ions per unit area may impact the walls 124 for the second ion bombardment step. In one example, the angle $\theta_2$ is 45°. Other angles for 02 can be utilized without departing from the scope of the present disclosure.

Figure 2E:
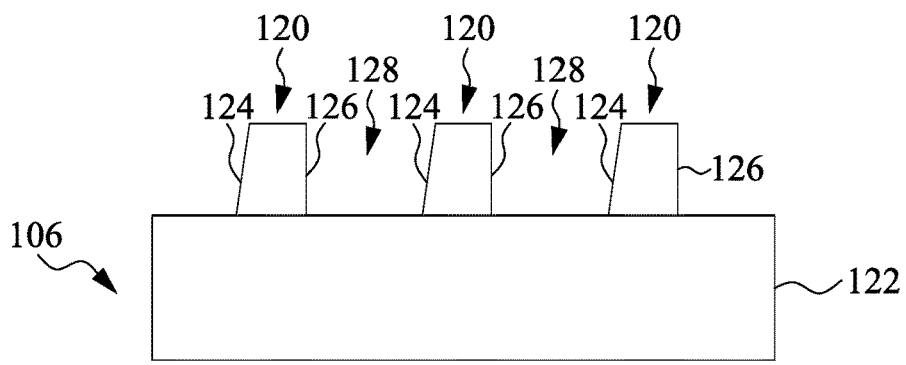

FIG. 2E illustrates the wafer 106 after the second ion bombardment step of the sides 124 of the photoresist structures 120. As can be seen, photoresist material has been removed from both the lower portions and the upper portions of the sides 124 of the photoresist structures 120. Using the high incident angle in the first ion bombardment step results in a slope on the sides 124 just above the lower part of the sides 124. This slope makes the second, low incident angle ion bombardment step more effective because the ions hit the sloped portion at an angle closer to normal.

Accordingly, the combination of the high incident angle first bombardment step and the low incident angle second bombardment step effectively removes material from the sides 124 of the photoresist structures 120. The combination of the high incident angle first ion bombardment step and low incident angle second bombardment step reduces the effect of shadowing and effectively removes the photoresist.

Figure 2F:
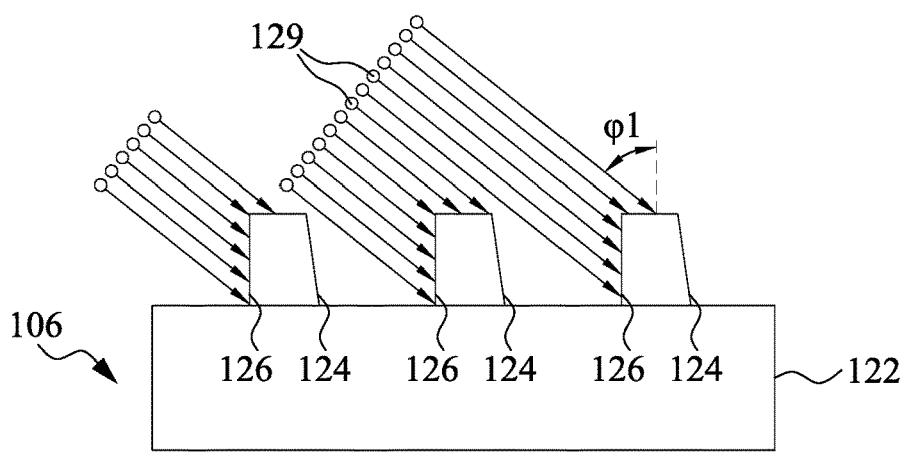

In FIG. 2F, the wafer 106 has been rotated 180° in the X-Y plane. The result is that the sides 126 of the photoresist structures 120 are exposed to the ion source 108 (see FIG. 1). In FIG. 2F, the first ion bombardment step is performed on the sides 126 of the photoresist structures 120. This corresponds to performing a first ion bombardment step on the second sides of the trenches 128. The ions 129 are output from the ion source 108 at the first angle $\theta_1$. In other words, the first ion bombardment step of the side 126 shown in FIG. 2F is substantially the same as the first ion bombardment step of the side 124 as illustrated in FIG. 2B. One potential difference is that a smaller portion of the side 126 may be affected by shadowing due to the removal of material from the first side 124 as described previously. The first ion bombardment step of the sides 126 results in removal of photoresist material from upper portions of the sides 126, as can be seen in FIG. 2G.

Figure 2G:
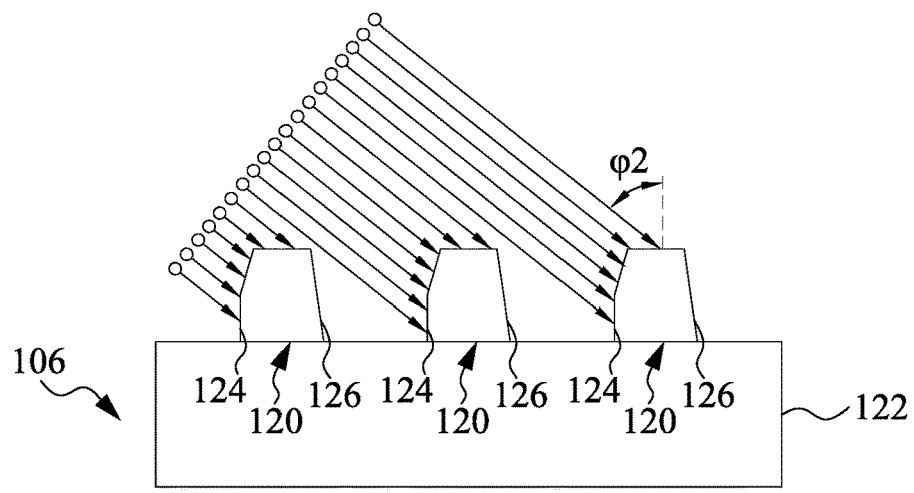

In FIG. 2G, the second ion bombardment step is performed on the sides 124 of the photoresist structure 120. This corresponds to performing a second ion bombardment step in the second sides of the trenches 128. The ions 129 are output from the ion source 108 at the second angle $\theta_2$. In other words, the second ion bombardment step of the side 126 shown in FIG. 2G is substantially the same as the second ion bombardment step of the side 124 as illustrated in FIG. 2D. The second ion bombardment step of the sides 124 results in removal of photoresist material from both the upper and lower portions of the sides 124.

Figure 2H:
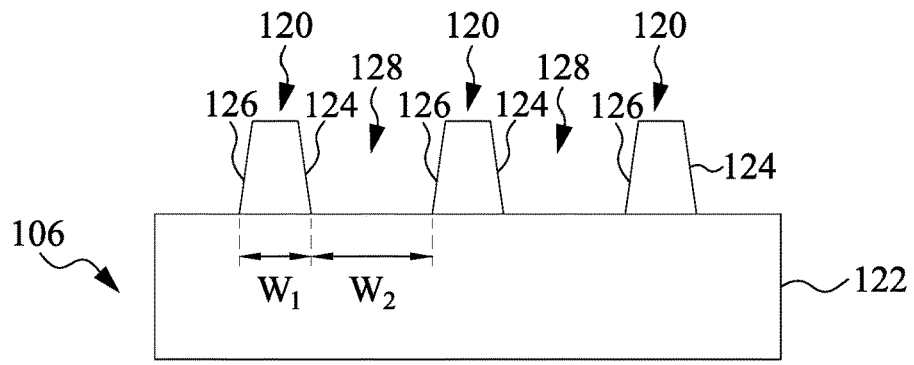

FIG. 2H illustrates the wafer 106 after the first and second ion bombardment steps have been performed on the sides 124 and 126 of the photoresist structures 120. A significant amount of photoresist material has been removed from both sides 124 and 126 of each of the resist structure 120. This corresponds to reducing the lateral width of the photoresist structures 120 in comparison to the photoresist structures 120 in FIG. 2A. The width W1 of the photoresist structures 120 in FIG. 2H is significantly reduced compared to the width W1 of the photoresist structures 120 of FIG. 2A. Correspondingly, the width W2 of the trenches 128 in FIG. 2H is significantly increased with respect to the width W2 of the trenches 128 in FIG. 2A.

The changes in in the widths W1 and W2 can be seen in FIGS. 2K and 2L. FIG. 2K is a top view of the wafer 106 at the processing stage of FIG. 2A. The top view of FIG. 2K illustrates the photoresist structures 120 extending in the Y dimension. The top view of FIG. 2K also illustrates the trenches 128 between photoresist structures 120. FIG. 2L illustrates the wafer 106 of the processing stage of FIG. 2H after the first and second ion bombardment steps have been performed on the sides 124 and 126 of the photoresist structures 120. As can be seen in FIGS. 2K and 2L, the width W1 of the photoresist structures 120 in the X dimension is significantly smaller in FIG. 2L than in FIG. 2K. As can be seen in FIGS. 2K and 2L, the width W2 of the trenches 128 between photoresist structures in the X dimension is significantly larger in FIG. 2L than in FIG. 2K. FIG. 2K illustrates the cut line A on which the cross-section of FIG.

2A is taken. FIG. 2L illustrates the cut line H on which the cross-section of FIG. 2H is taken.

In some embodiments the trenches 128 may initially be circular or otherwise rounded apertures when viewed from the top. After the ion bombardment steps, the circular or otherwise rounded apertures may be elongated in one or both of the X and Y directions.

Figure 2I:
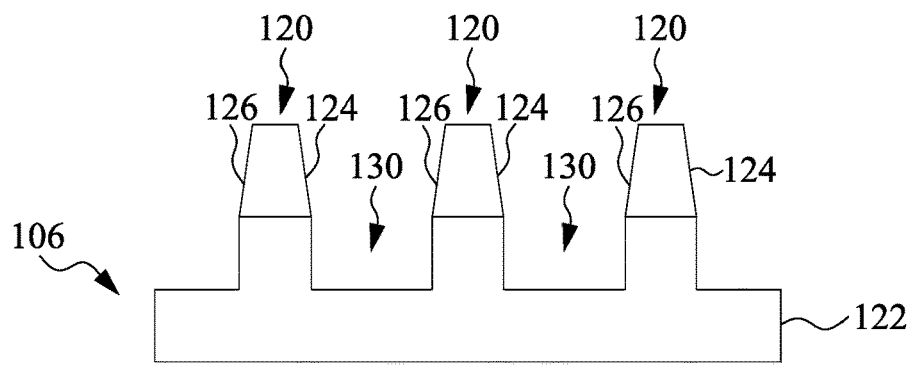

Returning to the cross-sectional views, FIG. 2I corresponds to a processing stage after the view of FIG. 2H. In FIG. 2I trenches 130 have been opened in the substrate 122. The trenches 130 are opened by etching process. The etching etches the portions of the substrate 122 exposed by the photoresist structures 120. Accordingly, the photoresist structures 120 act as a mask for patterning the substrate 122. The etching process can be selected based on the material of the substrate 122. The etching process can include wet etches, dry etches, or other types of etches.

Figure 2J:
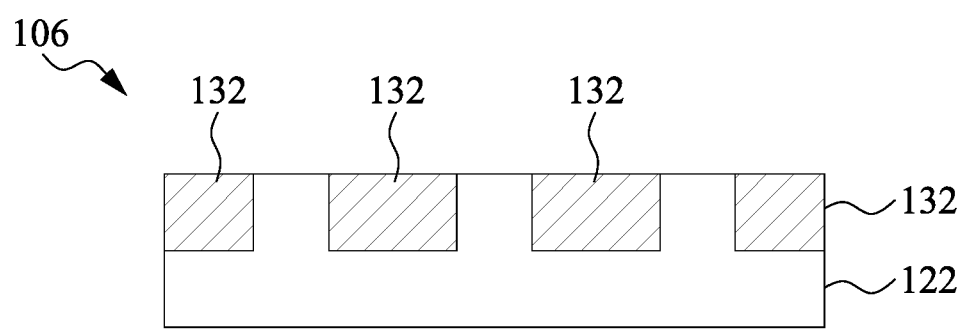
Figure 2K:
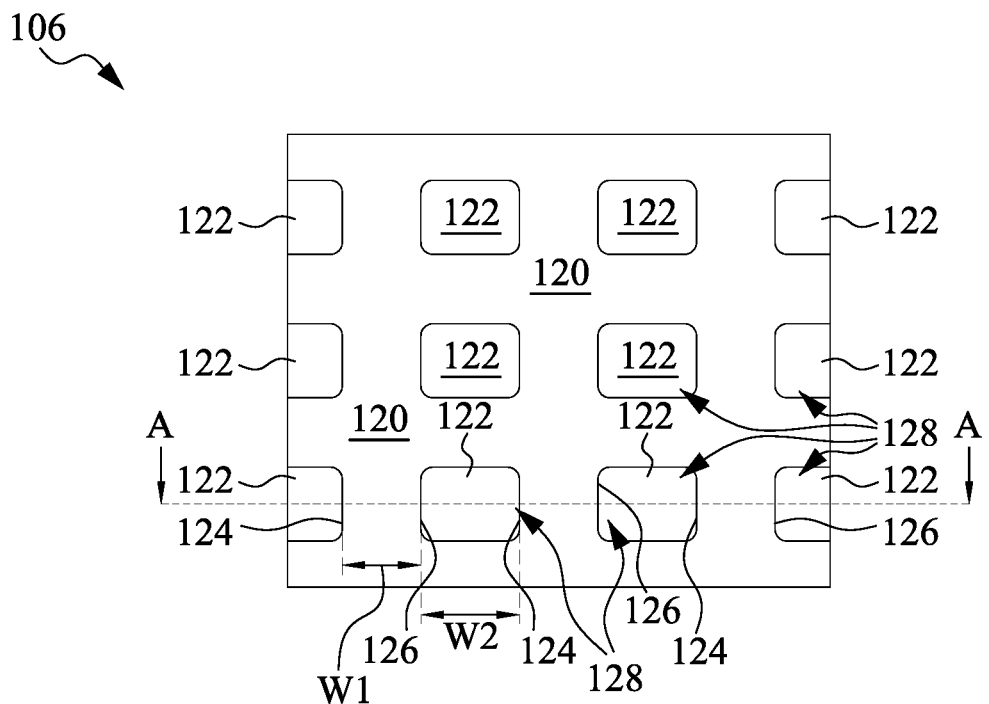
FIG. 2K is a top view of the wafer of FIG. 2A, according to one embodiment.
Figure 2L:
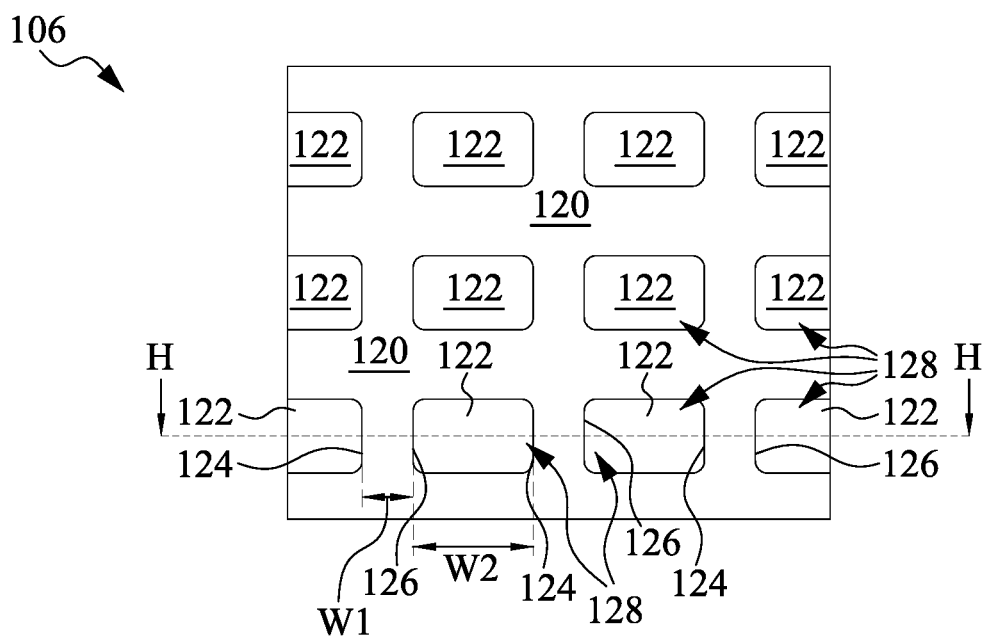
FIG. 2L is a top view of the wafer of FIG. 2H, according to one embodiment.

In FIG. 2J, a metal has been deposited in the trenches 130, thereby forming metal lines 132. The metal can include tungsten, titanium, aluminum, copper, gold, the team nitride, tantalum nitride, or other types of metals. The photoresist material 120 has been removed and a chemical mechanical planarization process has been performed to make the top surface of the metal lines 132 even with the top surface of the substrate 122. The process of FIGS. 2I and 2J is just one example of processing steps that can be performed using the fully patterned photoresist structures 120 as a mask. Other processes can be performed without departing from the scope of the present disclosure.

The foregoing description of FIGS. 2A-2H described an embodiment in which the multistep ion bombardment process included changing bombardment angles between ion bombardment steps. However, other multistep ion bombardment processes can be performed in accordance with principles of the present disclosure. Some of these processes will be described below with reference to FIGS. 2B and 2D. However, these other processes may use different process parameters and sequences than those described above. For example, other processes can use different angles, doses, energies or other parameters. Additionally, these other processes may result in different shapes or profiles of the remaining photoresist structures 120. The references to FIGS. 2B and 2D do not limit other processes to the characteristics shown and described previously in relation to FIGS. 2B and 2D.

In one embodiment, an ion bombardment process includes a first ion bombardment step and a second ion bombardment step. The energy of the ions is changed between the first ion bombardment step and the second ion bombardment step. In this example, both ion bombardment steps are performed with a sufficiently small bombardment angle that no shadowing occurs in either step. Both ion bombardment steps can be visualized with reference to FIG. 2D in which the angle $\theta_2$ is small enough to ensure that no shadowing occurs. The difference between the first ion bombardment step in the current embodiment and the ion bombardment step shown in FIG. 2D is that no material will have been removed and the current embodiment prior to the first ion bombardment step. Angles other than $\theta_2$ can be utilized in embodiments in which ion energy is changed between steps, without departing from the scope of the present disclosure.

The first ion bombardment step of a first side 124 is performed with a first, relatively low ion energy. The entirety of the first side 124 is impacted by the low-energy ions. The low ion energy results in little or no removal of photoresist material from the first side 124. However, as will be described in more detail below, the low ion energy reduces hardening.

After the first ion bombardment step of the first side 124, a second ion bombardment step is performed on the first side 124. The second ion bombardment step is at the same angle as the first ion bombardment step. The second ion bombardment step includes a second ion energy. The second ion energy is higher than the first ion energy. The result of the second ion bombardment step is the removal of photoresist material from the entirety of the first side 124, both upper and lower portions. This may result in a flatter profile of the first side 124 than is shown in FIG. 2E.

In one embodiment, the photoresist is a polymer material including polymer chains. Hardening of the polymer material occurs when high energy ions impact the polymer and cause a fusing of adjacent polymer chains. This fusing hardens the polymer and makes it more difficult to remove the polymer. However, lower energy ions do not have sufficient energy to fuse adjacent polymer chains, but cause loosening or breaking of the polymer chains. The loosened polymer chains do not fuse when bombarded with high energy ions. Instead, the loosened polymer chains are destroyed and removed by the high energy ions. Accordingly, if lower energy ions are first used to loosen the polymer chains, then subsequent bombardment by high energy ions will removed the loosened polymer chains without hardening them.

In one embodiment, the first ion energy is between 0.5 keV and 2.0 keV. If the first ion energy is higher than this range, then hardening effects may occur. If the first ion energy is lower than this range, then there may be substantially no effect on the photoresist. The second ion energy is between 4 keV and 8 keV. If the second ion energy is lower than this range, then little photoresist material may be removed from the first side 124. If the second ion energy is greater then this range, then too much photoresist material may be removed from the first side 124. In one example, the first ion energy is 1.0 keV and the second ion energy is 6 keV. Other ion energies can be utilized for the first and second ion bombardment steps without departing from the scope of the present disclosure. The duration of the first and second ion bombardment steps may be the same or different from each other.

After the first and second ion bombardment steps have been performed on the first side 124 at the respective low and high ion energies, the wafer 106 is rotated 180° as described in relation to FIG. 2F. The low and high energy ion bombardment steps are then performed on the second side 126.

In one embodiment, the first low-energy ion bombardment step may have a first ion dose and the second high energy ion bombardment step may have a second ion dose different than the first ion dose. The second ion dose may be higher than the first ion dose. In one example, the first low-energy dose of ions is between 1E14 and 2E15 ions. If the first low-energy dose of ions is lower than this range, then there may be little effect on the photoresist structures 122. If the first low-energy dose of ions is higher than this range, then hardening may occur. In one example, the second dose of ions is between 2E15 ions and 1E16 ions. If the second high energy dose of ions is lower than this range, then little photoresist material may be removed. If the second high-energy dose of ions is greater than this range, then too much photoresist material may be removed. Other doses can be utilized without departing from the scope of the present disclosure.

In another embodiment in which the ion bombardment angle changes between the first and second ion bombardment steps, as shown in FIGS. 2B and 2D, the ion energies are also changed between the first and second ion bombardment steps. In particular, in the first high incident angle ion bombardment step, the ions may have a low ion energy as described above. In the second low incident angle ion bombardment step, the ions may have a high energy as described above.

More than two ion bombardment steps may be performed on each side 124 and 126. For example, in one embodiment, three ion bombardment steps may be performed on each side 124 and 126. The first ion bombardment step is performed at the high incident angle as shown in FIG. 2B. The first ion bombardment step has a low ion energy. The second ion bombardment step is performed at the low incident angle as shown in FIG. 2D. The second ion bombardment step is also performed with the low ion energy. A third ion bombardment step is performed at the low incident angle as shown in FIG. 2D with the high ion energy.

In another embodiment, three ion bombardment steps may be performed on each side 124 and 126. The first ion bombardment step is performed at the high incident angle as shown in FIG. 2B. The first ion bombardment step has a low ion energy. The second ion bombardment step is performed at the high incident angle as shown in FIG. 2B. The second ion bombardment step is performed with the high ion energy. A third ion bombardment step is performed at the low incident angle as shown in FIG. 2D with the high ion energy.

In another embodiment, three or more ion bombardment steps may be performed on each side 124 and 126. Each of the three or more ion bombardment steps may have a different bombardment angle. In another embodiment, each of the three or more ion bombardment steps may have a different bombardment energy.

Figure 3:
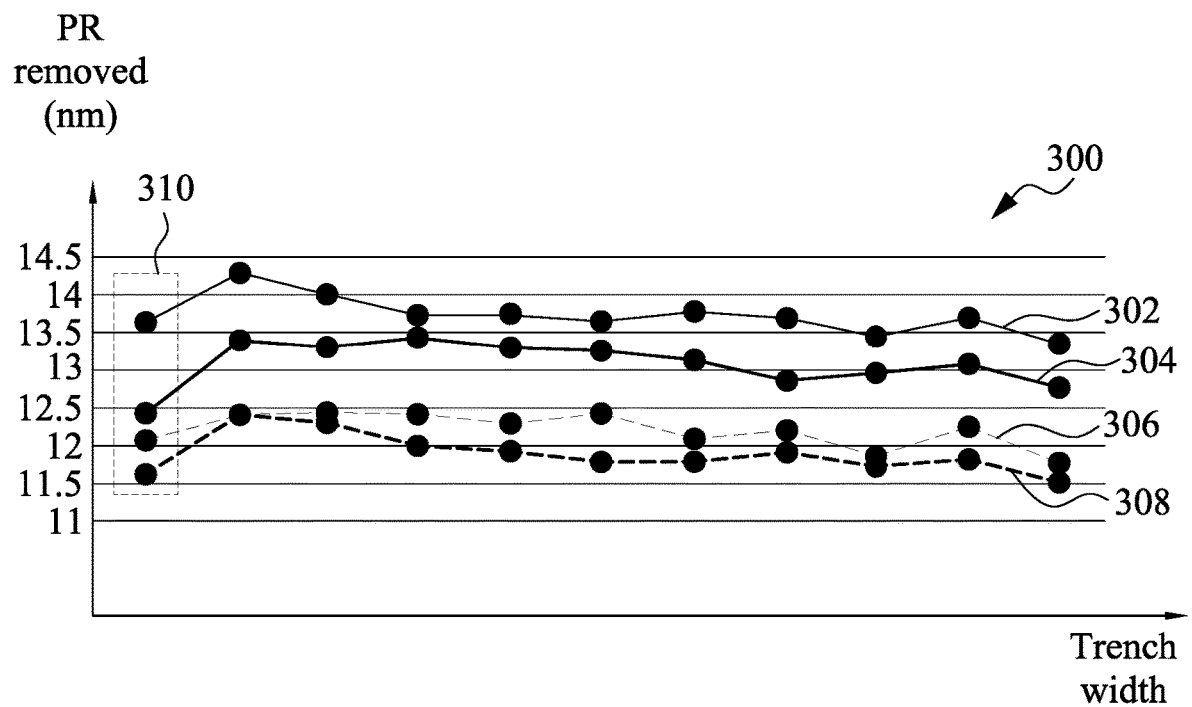
FIG. 3 is a graph illustrating changes in photoresist width for various ion bombardment characteristics, according to one embodiment.

FIG. 3 is a graph 300 illustrating photoresist removal for various ion bombardment processes versus trench with. Accordingly, the X-axis corresponds to the initial width W2 of the trenches as shown in FIG. 2A. The Y-axis corresponds to the change in the width W1 of the photoresist structures 120 after the ion bombardment processes have been performed on both the first side 124 and the second side 126. The line 302 corresponds to a multistep process in which the first ion bombardment step is a high incident angle ion bombardment step and the second ion bombardment step is a low incident angle ion bombardment step. The line 304 corresponds to a single step process in which the ion bombardment is performed only with the high incident angle. The line 306 corresponds to a multistep process in which the first ion bombardment step is a low incident angle ion bombardment step and the second ion bombardment step is a high incident angle ion bombardment step. The line 306 corresponds to a single step process in which the ion bombardment is performed only with the low incident angle.

The grouping 310 identifies the data point for each of the lines for which the initial width W2 is the lowest. The shadowing effect in this case is strongest because the photoresist structures 120 are relatively close together. As can be seen, the line 302 always results in a removal of a greater amount of photoresist material compared to other processes. Accordingly, a multi-step process in which a high incident angle is first used and a low incident angle is then used (as shown in FIGS. 2A-2H) can be very beneficial.

Though not shown in the Figures, a process in which a first ion bombardment step includes a low energy and high-dose while the second ion bombardment step includes a high-energy and low dose provides a greater removal of photoresist material than other combinations of energies and doses.

Figure 4A:
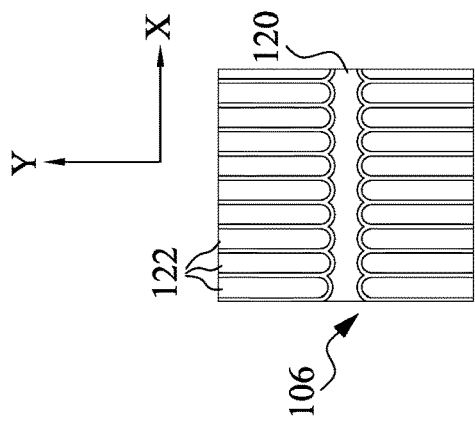
FIGS. 4A-4D are top views of wafers, according to one embodiment.

FIGS. 4A-4D are top views of integrated circuits 106 including elongated trenches 128 formed in photoresist, according to some embodiments. FIGS. 4A-4D illustrate relative widths in the X direction of the trenches 128 for various ion bombardment energies and doses. In FIG. 4A, ion bombardment has not been performed after initial formation of the trenches 128 in the photoresist 120.

Figure 4B:
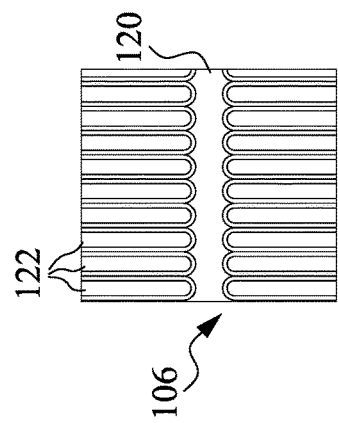

In FIG. 4B, a single ion bombardment step has been performed with ion energy of 6 keV and a dose of 4E15 ions. The width of the trenches 128 in the X direction is wider than the width of the trenches 128 of FIG. 4A.

Figure 4C:
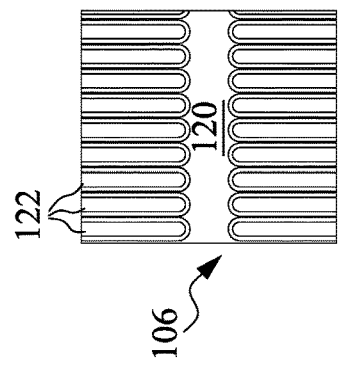

In FIG. 4C, a two-step ion bombardment processes been performed. The first ion bombardment step has an energy of 6 keV and a dose of 1E15. The second ion bombardment step has an energy of 1 keV and a dose of 3E15. The trenches 128 of FIG. 4C are wider than the trenches 128 of FIG. 4B. Accordingly, the two-step ion bombardment process of FIG. 4C results in the removal of more photoresist than the single step process of FIG. 4B.

Figure 4D:
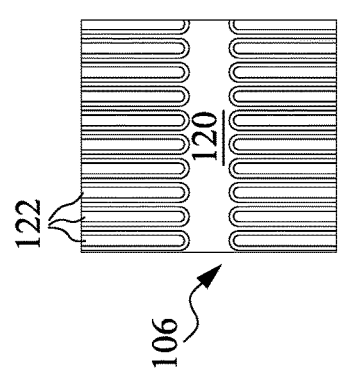

In FIG. 4D, a two-step ion bombardment process has been performed. The first ion bombardment step has an energy of 1 keV and a dose of 3E15. The second ion bombardment step has an energy of 6 keV and a dose of 1E15. The trenches 128 of FIG. 4D are wider in the X direction than the trenches 128 of FIG. 4C. Accordingly, the two-step ion bombardment process of FIG. 4D in which low-energy ions and the high-dose are used in the first step and high-energy ions with a low dose are used in the second step results in removal of more photoresist than the two-step process of FIG. 4C in which high-energy ions with a low dose are used in the first step and low-energy ions with a high dose are used in the second step.

Figure 5A:
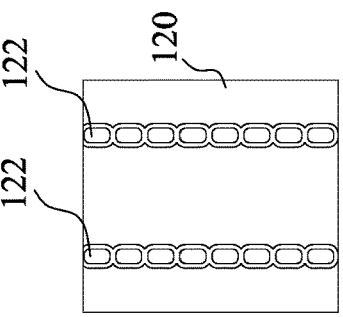
FIGS. 5A-5D are top views of wafers, according to one embodiment.
Figure 5B:
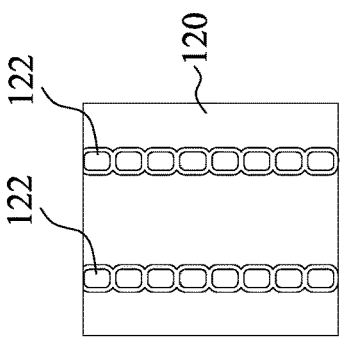
Figure 5C:
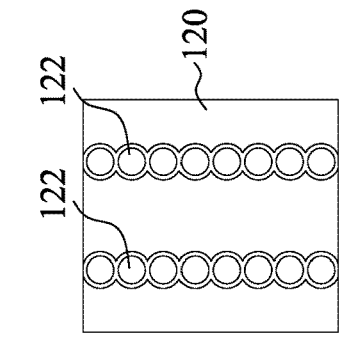
Figure 5D:
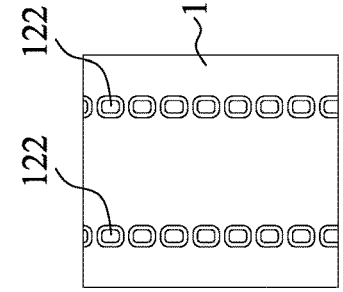
Figure 6:
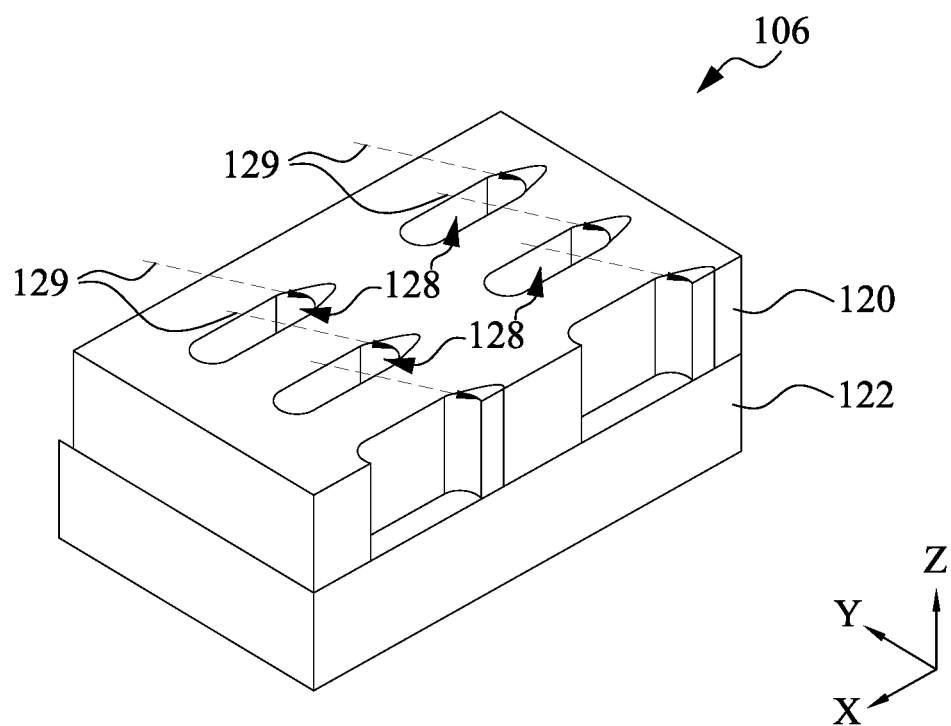
FIG. 6 is a perspective view of a wafer, according to one embodiment.

FIGS. 5A-5D are top views of integrated circuits 106 including nearly circular trenches 128 formed in photoresist 120, according to some embodiments. FIGS. 5A-5D utilize the processes described in relation to FIGS. 4A-4D. In particular, in FIG. 5A no ion bombardment processes been performed. In FIG. 5B, the same ion bombardment process as FIG. 4B has been performed. In FIG. 5C, the same ion bombardment process as FIG. 4C has been performed. In FIG. 5D, the same ion bombardment process of FIG. 4D has been performed. The width of the trenches in the X direction get progressively wider from FIG. 5A to 5D, similar to FIGS. 4A-4D. FIG. 6 is a perspective view of a wafer 106, according to one embodiment. The wafer 106 includes a substrate 120. Photoresist 120 has been deposited on the substrate 120 and trenches 128 have been formed in the photoresist 120 by a photolithography process. In FIG. 6, an ion bombardment step is performed. Ions 129 bombard the photoresist 120. The ion bombardment step can have the characteristics or parameters of any of the ion bombardment steps described previously. The ion bombardment step may be a first ion bombardment step, the second ion bombardment step, or another ion bombardment step in ion bombardment process. The result of the ion bombardment process is that the trenches 128 are widened. As can be seen in FIG. 6, in the X direction, the trenches 128 are somewhat rounded. The trenches 128 shown in FIGS. 2A-2K may also be rounded in a similar manner.

Figure 7:
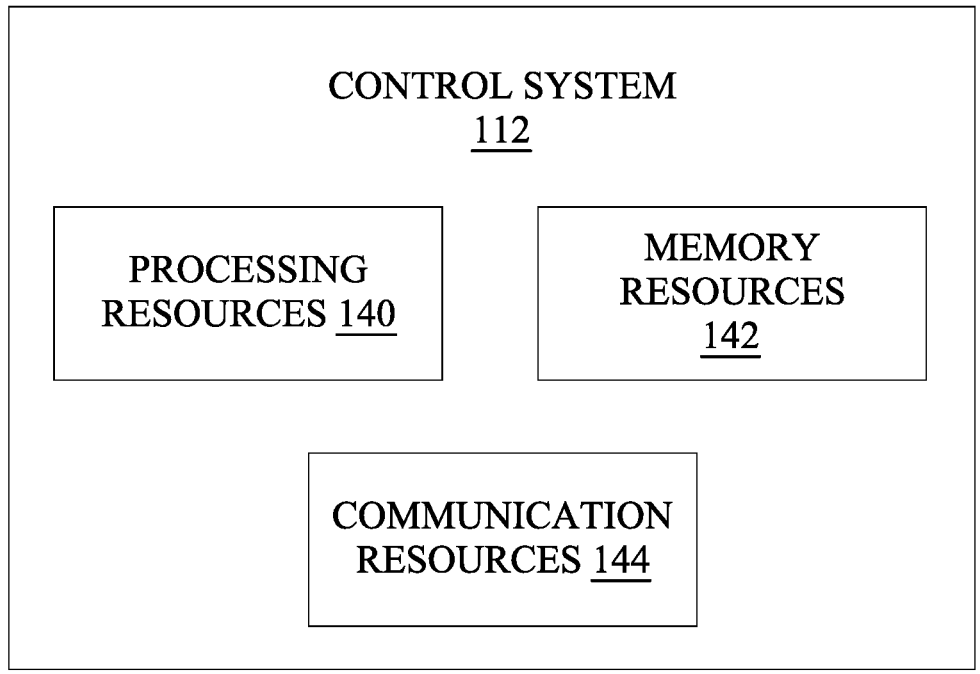
FIG. 7 is a block diagram of a control system, according to one embodiment.

FIG. 7 is a block diagram of the control system 112 of FIG. 1. The control system 112 includes processing resources 140, memory resources 142, and communication resources 144. The processing resources 140 can include one or more processors. The memory resources 142 can include one or more memories that include software instructions for controlling the ion source 108 and other components of the semiconductor process system 100 of FIG. 1. When the processors execute the software instructions stored in the memories, the control system 112 performs a process for controlling the semiconductor process system. The process can include performing the multiple ion bombardment steps and wafer rotation as described previously.

The control system 112 also includes communication resources 144. The communication resources can include wireless transceivers, wired connections, and circuitry for outputting and receiving signals via the wireless transceivers and or wired connections. Accordingly, the communication resources 144 can relay commands for controlling the components of the semiconductor process system 100.

Figure 8:
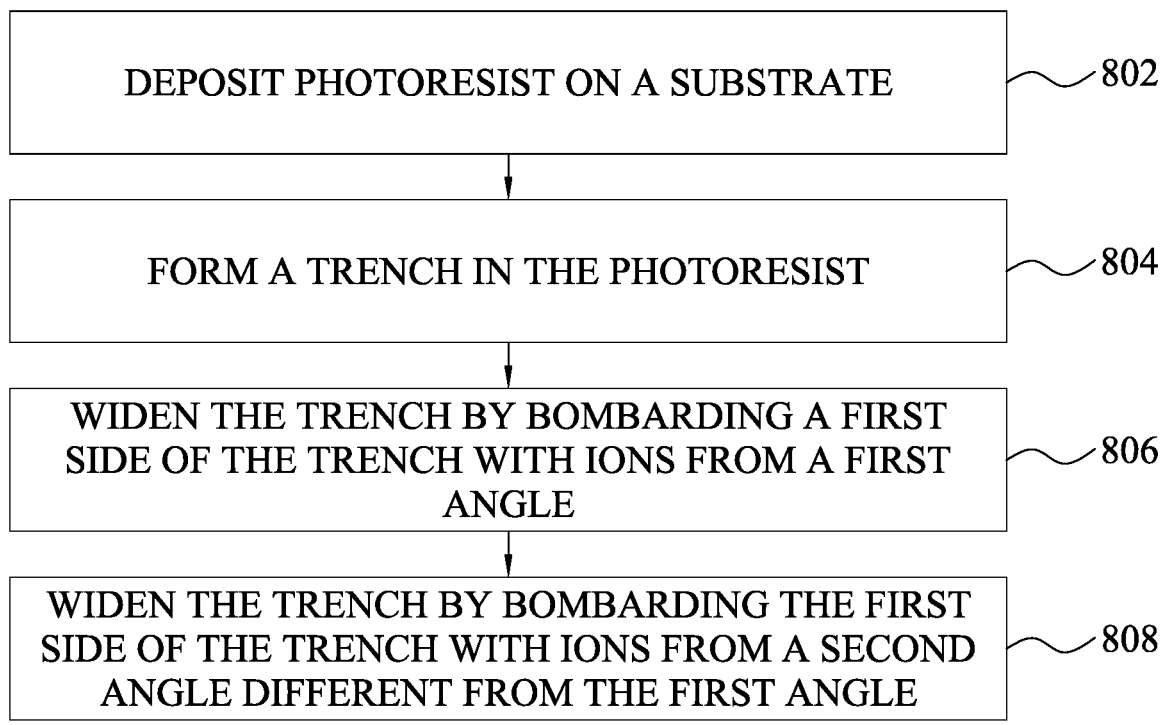
FIG. 8 is a flow diagram of a method for processing a wafer, according to one embodiment.

FIG. 8 is a flow diagram of a method 800 for performing a semiconductor process, according to one embodiment. The method 800 can utilize the systems, structures, components, and processes described in relation to FIGS. 1-6. At 802, the method 800 includes depositing photoresist on a substrate one example of a substrate is the substrate 122 of FIG. 2A. At 804, the method 800 includes forming a trench in the photoresist one example of a trench is the trench 128 of FIG. 2A. At 806, the method 800 includes widening the trench by bombarding a first side of the trench with ions from a first angle. One example of a first side is the side 124 of the photoresist structure 120 of FIG. 2B. At 808, the method 800 includes widening the trench by bombarding the first side of the trench with ions from a second angle different from the first angle.

Figure 9:
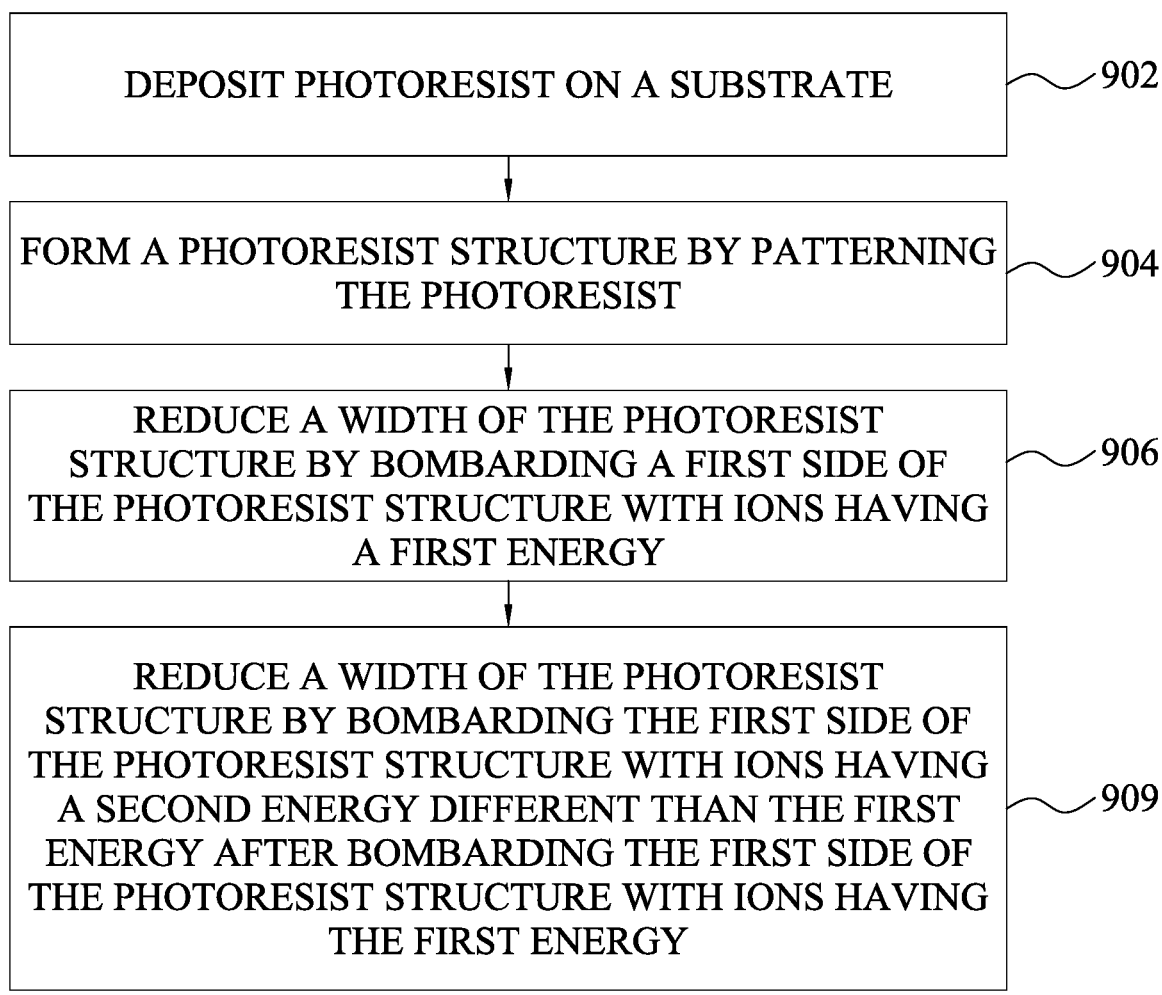
FIG. 9 is a flow diagram of a method for processing a wafer, according to one embodiment.

FIG. 9 is a flow diagram of a method 900 for performing a semiconductor process, according to one embodiment. The method 900 can utilize the systems, structures, components, and processes described in relation to FIGS. 1-5D. At 902, the method 900 includes depositing photoresist on a substrate. One example of a substrate is the substrate 122 of FIG. 2A. At 904, the method 900 includes forming a photoresist structure by patterning the photoresist. One example of a photoresist structure is the photoresist structure 120 of FIG. 2A. At 906, the method 900 includes reducing a width of the photoresist structure by bombarding a first side of the photoresist structure with ions having a first energy. One example of a first side is the side 124 of the photoresist structure 120 of FIG. 2B. At 909, the method 900 includes bombarding the first side of the photoresist structure with ions having a second energy different than the first energy after bombarding the first side of the photoresist structure with ions having the first energy.

In one embodiment, a method includes depositing photoresist on a substrate, forming a trench in the photoresist, and widening the trench by bombarding a first side of the trench with ions from a first angle and bombarding the first side of the trench with ions from a second angle different from the first angle.

In one embodiment, a method includes depositing photoresist on a substrate and forming a photoresist structure by patterning the photoresist. The method includes reducing a width of the photoresist structure by bombarding a first side of the photoresist structure with ions having a first energy and bombarding the first side of the photoresist structure with ions having a second energy different than the first energy after bombarding the first side of the photoresist structure with ions having the first energy.

In one embodiment, a system includes a semiconductor process chamber, a wafer support configured to support a wafer in the semiconductor process chamber, an ion source positioned to bombard the wafer with ions, and a control system coupled to the ion source. The control system includes at least one processor and at least one memory coupled to the at least one processor, the at least one memory having stored therein, instructions which, when executed by the one or more processors, cause the ion source to bombard, from a first angle, a side of a photoresist structure on a wafer in a first ion bombardment step, to bombard, from the first angle, the side of the photoresist structure on a wafer in second ion bombardment step, and to bombard, from a second angle different than the first angle, the side of the photoresist structure in a third ion bombardment step.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
depositing photoresist on a substrate;
forming a trench in the photoresist;
widening the trench by:
bombarding a first side of the trench with ions from a first angle and with a first energy in a first ion bombardment process selected to loosen polymer chains of the photoresist, wherein the first angle is between 55 degrees and 65 degrees relative to vertical and the first energy is between 0.5 keV and 2.0 keV; and
bombarding the first side of the trench with ions from a second angle different from the first angle and with a second energy different than the first energy in a second ion bombardment process after the first ion bombardment process, wherein the second ion bombardment process is selected to destroy the loosened polymer chains, wherein the second angle is between 40 degrees and 50 degrees relative to vertical and the second energy is between 4 keV and 8 keV; and
bombarding a second side of the trench from the first angle in a third ion bombardment process after the second ion bombardment process.

2. The method of claim 1, further comprising widening the trench by:
bombarding the second side of the trench from the second angle in a fourth ion bombardment process after the third ion bombardment process.

3. The method of claim 2, further comprising rotating the substrate 180 degrees between the second ion bombardment process and the third ion bombardment process.

4. The method of claim 1, wherein the first angle is 60 degrees and the second angle is 45 degrees.

5. The method of claim 1, wherein the first energy is 1 keV, wherein the second energy is 6 keV.

6. The method of claim 1, wherein the first ion bombardment process includes bombarding the first side of the trench with a first dose of ions, wherein the second ion bombardment process includes bombarding the first side of the trench with a second dose of ions greater than the first dose.

7. The method of claim 1, further comprising, after widening the trench:
  etching the substrate using the photoresist as a mask; and
  depositing a metal in the substrate.
8. The method of claim 1, wherein the ions are argon ions.
9. A method, comprising:
  depositing photoresist on a substrate;
  forming a photoresist structure by patterning the photoresist;
  reducing a width of the photoresist structure by:
    bombarding a first side of the photoresist structure in a first ion bombardment process from a first angle and with a first energy selected to loosen polymer chains of the photoresist, wherein the first angle is between 55 degrees and 65 degrees relative to vertical and the first energy is between 0.5 keV and 2.0 keV;
    bombarding the first side of the photoresist structure with ions in a second ion bombardment process from a second angle different from the first angle and with a second energy different than the first energy after bombarding the first side of the photoresist structure with the first ion bombardment process, wherein the second ion bombardment process is selected to destroy the loosened polymer chains, wherein the second angle is between 40 degrees and 50 degrees relative to vertical and the second energy is between 4 keV and 8 keV; and
    bombarding a second side of the photoresist structure with ions in a third ion bombard process from the first angle after the second ion bombardment process.
10. The method of claim 9, further comprising reducing the width of the photoresist structure by:
  bombarding the second side of the photoresist structure with ions having the first energy in the third ion bombardment process; and
  bombarding the second side of the photoresist structure with ions having the second energy in a fourth ion bombardment process after the third ion bombardment process.
11. The method of claim 10, wherein the first energy is 1 keV, wherein the second energy is 6 keV.
12. The method of claim 10, wherein bombarding the first side of the photoresist structure with ions from the first energy includes bombarding the first side of the photoresist structure with a first dose of ions, wherein bombarding the first side of the photoresist structure with ions from the first energy includes bombarding the first side of the photoresist structure with a second dose of ions less than the first dose.
13. A method, comprising:
  supporting with a wafer support in a semiconductor process chamber;
  bombarding, with an ion source, a first side of a photoresist structure on a wafer in a first ion bombardment step from a first angle and with a first energy selected to loosen polymer chains of the photoresist, wherein the first angle is between 55 degrees and 65 degrees relative to vertical and the first energy is between 0.5 keV and 2.0 keV;
  bombarding, with the ion source, the first side of the photoresist structure in a second ion bombardment step from a second angle different than the first angle and with a second energy different than the first energy after the first ion bombardment step, wherein the second ion bombardment process is selected to destroy the loosened polymer chains, wherein the second angle is between 40 degrees and 50 degrees relative to vertical and the second energy is between 4 keV and 8 keV; and
  bombarding, with the ion source, a second side of the photoresist structure from the first angle in a third ion bombardment step after the second ion bombardment step.
14. The method of claim 13, wherein the third ion bombardment step has the first energy.
15. The method of claim 13, wherein the second and third ion bombardment steps have the second energy.
16. The method of claim 15, wherein the third ion bombardment step has a third energy lower than the second energy.
17. The method of claim 13, wherein the first angle is 60 degrees.
18. The method of claim 13, wherein the second angle is 45 degrees.
19. The method of claim 13, wherein the first energy is 1 keV.
20. The method of claim 13, wherein the second energy is 6 keV.

* * * * *